United States Patent [19]

Pigeon

[11] Patent Number: 5,436,938
[45] Date of Patent: Jul. 25, 1995

[54] PHASE ERROR DETECTOR FOR A PHASE LOCKED LOOP

[75] Inventor: J. P. R. Michel Pigeon, Ottawa, Canada

[73] Assignee: Northern Telecom Limited, Montreal, Canada

[21] Appl. No.: 109,025

[22] Filed: Aug. 19, 1993

[51] Int. Cl.⁶ .................................................. H03D 3/24
[52] U.S. Cl. ................................ 375/376; 375/375; 331/1 A; 331/25; 331/57; 327/147
[58] Field of Search ...................... 375/118, 119, 120; 331/1 A, 45, 57, 25; 455/276.1; 328/162, 167, 63, 72; 307/510, 511, 512, 591

[56] References Cited

U.S. PATENT DOCUMENTS

| | | | |
|---|---|---|---|
| 3,931,588 | 1/1976 | Gehweiler | 331/57 |
| 4,494,021 | 1/1985 | Bell et al. | 307/591 |
| 4,706,040 | 11/1987 | Mehrgardt | 331/1 A |
| 4,859,970 | 8/1989 | Matsuo et al. | 331/57 |
| 4,988,960 | 1/1991 | Tomisawa | 332/127 |
| 5,126,691 | 6/1992 | Mijuskovic et al. | 331/1 A |
| 5,250,913 | 10/1993 | Gleichert et al. | 331/25 |

Primary Examiner—Stephen Chin
Assistant Examiner—Bryan E. Webster
Attorney, Agent, or Firm—R. John Haley

[57] ABSTRACT

A phase lock loop (PLL) arrangement includes a voltage controlled ring oscillator (VCRO) including delay elements whose delay is controlled by a control voltage produced by the PLL. A phase error detector is provided which compares pulses of a PLL feedback frequency with pulses of a delayed reference signal, the delay being provided by further delay elements controlled by the same control voltage. The phase error detector produces an output signal which indicates when phase error exceeds a predetermined tolerance, and also indicates an absence of frequency lock.

4 Claims, 2 Drawing Sheets

PHASE ERROR DETECTOR FOR A PHASE LOCKED LOOP

This invention relates to phase lock loops (PLLs), and is particularly concerned with a phase error detector for a PLL which incorporates a voltage controlled ring oscillator (VCRO).

BACKGROUND OF THE INVENTION

It is well known to provide a PLL using a VCRO for generating a local clock signal which is locked in frequency and phase to a reference frequency, and to use frequency dividers in such a PLL to provide a desired relationship between the frequency of the local clock signal and the reference frequency. In such an arrangement, the VCRO conveniently comprises an inverting delay line whose output is connected to its input, the delay line comprising a plurality of identical delay elements whose delay is determined by a control voltage which is supplied by the PLL to determine the oscillation frequency of the VCRO.

It is also known, from Bell et al. U.S. Pat. No. 4,494,021 issued Jan. 15, 1985 and entitled "Self-Calibrated Clock And Timing Signal Generator For MOS/VLSI Circuitry", to provide such an arrangement for calibrating a tapped delay line, comprising further identical delay elements controlled by the same control voltage, whose output taps are coupled to a programmable logic circuit to provide arbitrary output waveforms from an input signal supplied to the tapped delay line.

Tomisawa U.S. Pat. No. 4,988,960 issued Jan. 29, 1991 and entitled "FM Modulation Device And FM Demodulation Device Employing A CMOS Signal Delay Device" discloses another arrangement of a PLL using a VCRO including delay elements whose control voltage is also used to control the delay of identical delay elements in a controlled circuit, such as an FM modulator or demodulator.

These references are not concerned with phase error detection or with phase lock detection for the PLL.

An object of this invention is to provide an improved phase error detector for a PLL using a VCRO.

SUMMARY OF THE INVENTION

According to one aspect of this invention there is provided a phase lock loop (PLL) arrangement comprising: a voltage controlled ring oscillator (VCRO) comprising a plurality of delay elements; a phase lock circuit responsive to a feedback signal derived from the VCRO and a reference signal to produce a control voltage which determines a delay of the delay elements thereby to establish a frequency and phase lock between an output signal of the VCRO and the reference signal; and a phase error detector comprising: a delay circuit, comprising a plurality of delay elements controlled by said control voltage, responsive to the reference signal to produce a delayed signal having pulses centered relative to pulses of the feedback signal when the PLL arrangement is in a state of frequency and phase lock with zero phase error; and logic circuitry responsive to the delayed signal and the feedback signal to produce an output signal in response to a phase error exceeding a predetermined tolerance.

The arrangement preferably includes a frequency divider which produces the feedback signal from the output signal of the VCRO. In an embodiment of the invention described in detail below, a particularly simple arrangement is provided in that the frequency divider has a frequency division factor of three and the delay circuit provides a delay equal to one quarter of the period of the output signal of the VCRO.

The arrangement may also include a frequency multiplier for producing a frequency multiplied signal at a frequency which is n times the frequency of the reference signal, where n is a plural integer, comprising: a tapped delay line comprising delay elements controlled by said controlled voltage, the tapped delay line being supplied with the reference signal and having n-1 outputs at which the reference signal is produced with delays between successive outputs equal to the period of the reference signal divided by 2n; and logic circuitry responsive to the reference signal and the outputs of the tapped delay line to produce the frequency multiplied signal.

BRIEF DESCRIPTION OF THE DRAWINGS

The invention will be further understood from the following description with reference to the accompanying drawings, in which.

DETAILED DESCRIPTION

Figure 1:
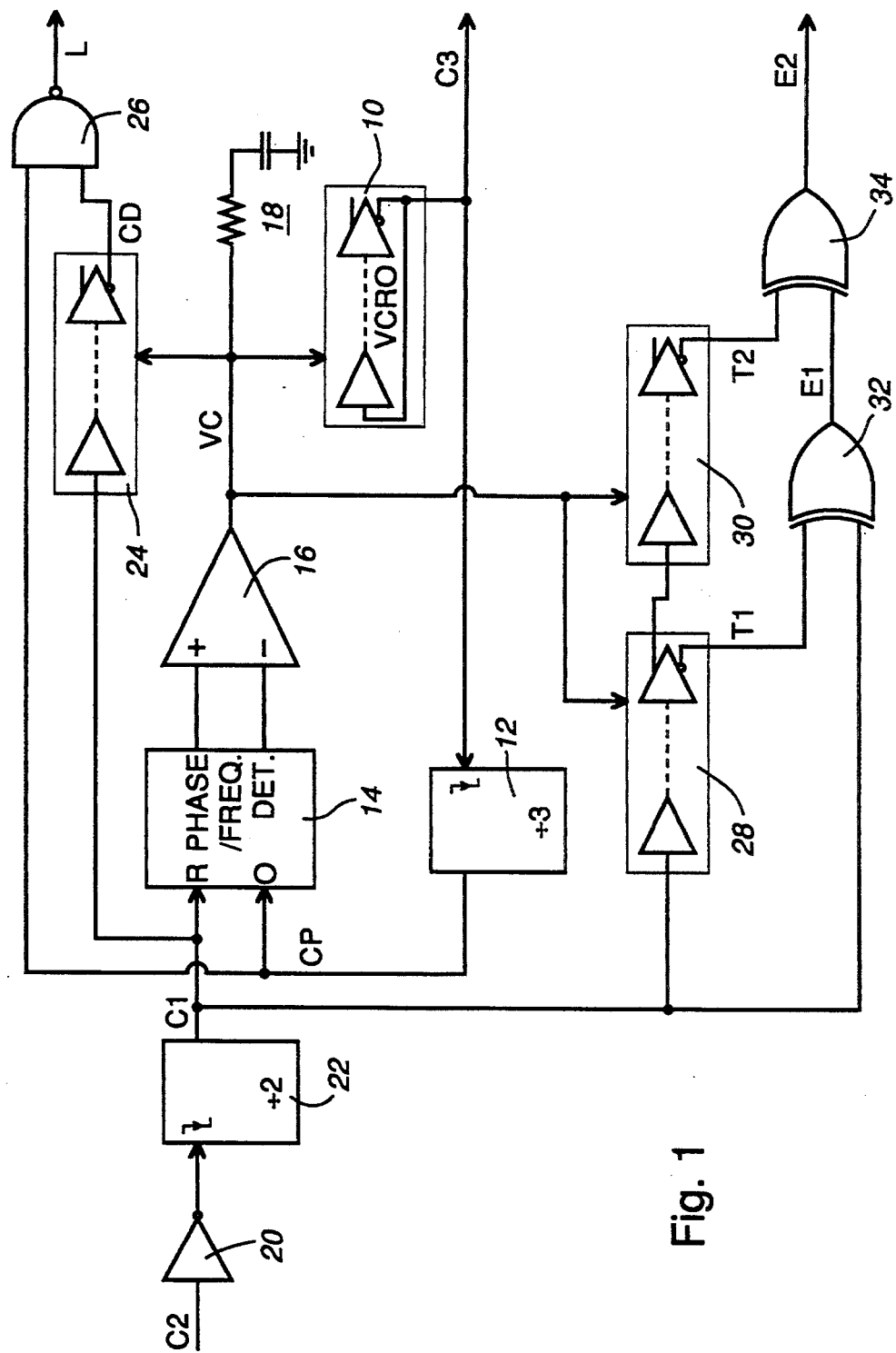
FIG. 1 schematically illustrates a PLL circuit including a phase error detector in accordance with an embodiment of the invention.

Referring to FIG. 1, a PLL circuit is illustrated which comprises a VCRO 10, a feedback frequency divider 12, a phase/frequency detector 14, a differential amplifier 16, and a loop filter 18. The circuit also includes an input inverter 20 and a reference frequency divider 22.

As is well known, in such a PLL circuit the VCRO 10 consists of an inverting delay line whose output is connected to its input, the delay line comprising a plurality of identical delay elements whose signal propagation delay is determined by a control voltage VC which is produced at the output of the amplifier 16 and is filtered by the loop filter 18, which as shown consists of a resistor and a capacitor connected in series between the output of the amplifier 16 and ground. An output signal C3 of the VCRO 10 is divided in frequency by the divider 12 to produce a signal CP which is supplied to an oscillator signal input O of the detector 14. A reference signal input R of the detector 14 is supplied with a signal C1, which is produced from an input reference frequency C2 by inversion in the inverter 20 and frequency division in the divider 22. Outputs of the detector 14, which is responsive to the falling edges of the signals C1 and CP, are connected to differential inputs of the amplifier 16.

The characteristics of the PLL circuit, such as the frequency division factors, the number of delay elements in the VCRO, and the frequencies of the various signals, are arbitrary. Purely by way of illustration and convenience of description, it is assumed here that the frequency dividers 12 and 22 have division factors of 3 and 2 respectively, so that in normal operation the signal C3 has three times the frequency of the signal C1 which has half the frequency of the signal C2. For example, the signals C1, C2, and C3 can have frequencies of approximately 13, 26, and 39 MHz respectively. Consistent with this, the VCRO 10 may comprise 8 delay elements each controlled to provide a delay of approximately 1.6 ns. As represented in FIG. 1, at least the final delay element provides differential outputs an inverting one of which is used to provide the desired signal inversion around the VCRO loop. Alternatively, an odd number of inverting delay elements can be used in the VCRO, or the VCRO can include an inverter, to provide this inversion.

The circuit of FIG. 1 also includes a phase error and lock detector which comprises a delay circuit 24 and a NAND gate 26. The delay circuit 24, consisting of 10 delay elements which are identical to the delay elements of the VCRO 10 and whose delay is controlled by the same control voltage VC, is supplied with the signal C1 and inverts and delays this by a predetermined delay to produce a signal CD. The gate 26 has the signals CD and CP supplied to its inputs and produces an output signal L as described below.

Consistent with the parameters given above, the delay circuit 24 for example consists of 4 delay elements providing a total delay of t=6.4 ns, this being one quarter of the period of the signal C3.

Figure 2:
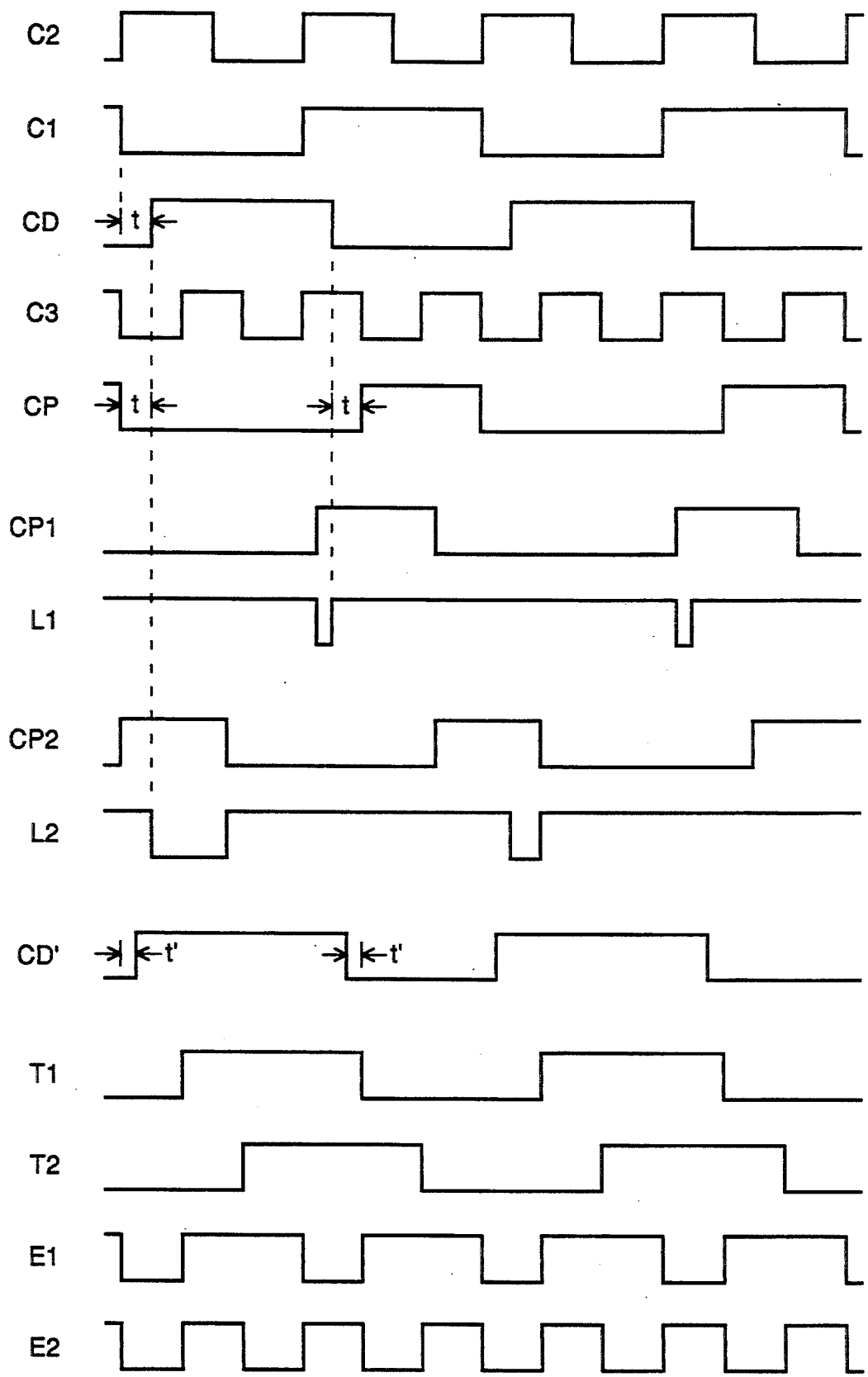
FIG. 2 is a signal timing diagram with reference to which operation of the circuit of FIG. 1 is explained.

The upper part of FIG. 2 illustrates the signals C1, C2, C3, CD, and CP for an ideal situation in which there is a frequency lock and phase lock with zero phase error between the signals C2 and C3. This part of FIG. 2 clearly shows the frequency relationship of the signals C1, C2, and C3, and the delay t of the signal CD relative to the signal C1. The signal CP produced by the +3 frequency divider 12 has a 33% duty cycle, as a result of which pulses of the signals CD and CP are offset from one another in each case by the time t, which constitutes a phase error tolerance for the PLL. In consequence, the output signal L is a constant logic 1, indicating frequency and phase lock within the phase error tolerance. It should be appreciated that the frequency dividers 12 and 22 have substantially the same delay for rising and falling signal edges, so that the signal duty cycles shown in FIG. 2 are preserved.

In practice, when it is frequency locked the PLL will have a phase error other than zero, corresponding to an advancing or a retarding of the signal CP relative to the signal CD. A small advance or retard by less than the tolerance t produces no change in the signal L. If the phase error increases to more than the tolerance t, for example if as shown in FIG. 2 the signal CP is advanced to a signal CP1, then the output signal L has the form of a signal L1 in FIG. 2 in which it has a logic zero pulse during each cycle of the signal C1. The (constant) width of the pulses of the signal L1 provides an indication of the extent of the phase error.

In the absence of frequency lock of the PLL, as shown in FIG. 2 the signal CP may have the form of a signal CP2, as a result of which the output signal L has the form of a signal L2. The signal L2 has zero pulses of varying widths in different cycles of the signal C1 which indicate an out-of-lock condition.

The output signal L can for example be supplied to an active-low set input of a set-reset flip-flop which is periodically reset. The set state of the flip-flop then indicates that the PLL is not locked or has an excessive phase error, whereas the reset state of the flip-flop indicates that the PLL is locked with a phase error within the tolerance t. Because the delay circuit 24 and the VCRO 10 contain identical delay elements, for example being formed within a single integrated circuit so that they have the same characteristics, the phase error and lock detection is accurate and reliable despite manufacturing process and temperature variations.

In addition, or alternatively, the widths of any pulses of the output signal L can be monitored in any desired manner to determine the extent of an excessive phase error, or the extent of a frequency error when the PLL is not locked.

As described above and illustrated in FIG. 2, the phase error tolerance t is conveniently half the difference between the pulse widths of the signals CD and CP, so that simply delaying the signal C1 by t centers the pulses of the signal CD between the pulses of the signal CP when the phase error is zero, as shown in the upper part of FIG. 2. In general, this situation will not apply, and a more complicated arrangement, typically comprising a tapped delay circuit with logic circuitry connected to a plurality of taps, will be required in place of the delay circuit 24 to produce the signal CD in this centered manner when the phase error is zero.

For example, if in the above example the phase error tolerance (now denoted t') were required to be only 3.2 ns, then the signal CD would instead be required to have the form of a signal CD' also shown in FIG. 2. As can readily be appreciated, this signal CD' can be produced in the circuit of FIG. 1 by replacing the delay circuit 24 by a tapped delay circuit, again comprising identical delay elements, with inverting outputs at taps with delays of 3.2 and 9.6 ns (i.e. the tapped delay circuit could consist of 6 delay elements) coupled to inputs of an OR gate whose output produces the signal CD'. As is clearly shown by FIG. 2, again the pulses of the signal CD' are centered between the pulses of the zero phase error signal CP.

Arbitrary other phase error tolerances, limited by the discrete delay of an individual delay element, can be provided in the circuit of FIG. 1 in a similar manner with an appropriate combination of delay elements and gating circuitry, as will be readily apparent to persons of ordinary skill in the art.

As an alternative to using the signal C3, which may be subject to large phase error, in subsequent circuits, the circuit of FIG. 1 also provides a signal E2 which, as shown in FIG. 2, has the same form as the signal C3 but may be subject to less phase error. The signal E2 is produced from the signal C1 by a frequency tripler which comprises two delay circuits 28 and 30 and two Exclusive-OR gates 32 and 34.

The delay circuits 28 and 30 each comprise 8 delay elements, identical to the delay elements in the VCRO 10 and controlled by the same control voltage VC, so that each delay circuit provides a signal delay of 12.8 ns, or one sixth of the period of the signal C1. The delay circuits 28 and 30 each have an inverting output at which signals T1 and T2 respectively are produced, inputs of the delay circuits 28 and 30 being supplied with the signal C1 and a non-inverted output of the delay circuit 28, respectively. The signals C1 and T1 are supplied to the gate 32 which produces a signal E1 at its output, and the signals E1 and T2 are supplied to the gate 34 which produces the signal E2 at its output. The signals E1, T1, and T2 are also shown in FIG. 2.

Considered more generally, the frequency tripler shown in FIG. 1 is a particular case (n=3) of a frequency multiplier which multiplies the frequency of an input square wave signal by a plural integer n to produce an output square wave signal, the frequency multiplier comprising a tapped delay line providing n-1 outputs at which the input square wave is produced in inverted form with delays between successive taps equal to the period of the input square wave divided by 2n, and n-1 Exclusive-OR gates each of which combines the output of a respective tap of the delay line with the output of the preceding Exclusive-OR gate (or the input square wave signal, for the first Exclusive-OR gate) and from the output of the last of which gates the frequency-multiplied signal is derived.

Although the frequency tripler in FIG. 1 is used to produce the signal E2 with the same frequency as the signal C3, in general one or more frequency multipliers of this form may be used to produce one or more output frequencies which are multiples of the frequency of the signal C1 and which may be different from the frequency of the signal C3.

Although a particular embodiment of the invention has been described in detail, it should be appreciated that numerous modifications, variations, and adaptations may be made without departing from the scope of the invention as defined in the claims. In particular, the relative and absolute frequencies of the various signals may be varied, the arrangements of the delay and gating circuits may be varied (for example, the delay circuit 24 can be constituted by part of the circuit 28), different numbers of delay elements may be used, and different inversion arrangements (e.g. supplying the signal C1 to the delay circuit 24 in inverted form from an inverting output of the frequency divider 22) may be provided as desired to suit particular requirements.

What is claimed is:

1. A phase lock loop (PLL) arrangement comprising:
    a voltage controlled ring oscillator (VCRO) for producing an output signal, the VCRO comprising a plurality of delay elements;
    a phase lock circuit responsive to a feedback signal derived from the output signal of the VCRO and a reference signal to produce a control voltage which determines a delay of the delay elements thereby to establish a frequency and phase lock between an output signal of the VCRO and the reference signal; and
    a phase error detector comprising:
        a delay circuit, comprising a plurality of further delay elements controlled by said control voltage, responsive to the reference signal to produce a delayed signal having pulses centered in time relative to pulses of the feedback signal when the PLL arrangement is in a state of frequency and phase lock with zero phase error; and
        logic circuitry responsive to the delayed signal and the feedback signal to produce a further output signal in response to a phase error exceeding a predetermined tolerance.

2. A PLL arrangement as claimed in claim 1 and including a frequency divider which produces the feedback signal from the output signal of the VCRO.

3. A PLL arrangement as claimed in claim 2 wherein the frequency divider has a frequency division factor of three and the delay circuit provides a delay equal to one quarter of the period of the output signal of the VCRO.

4. A PLL arrangement as claimed in claim 1 and including a frequency multiplier for producing a frequency multiplied signal at a frequency which is n times the frequency of the reference signal, where n is a plural integer, comprising:
    a tapped delay line comprising additional delay elements controlled by said controlled voltage, the tapped delay line being supplied with the reference signal and having n-1 outputs at which the reference signal is produced with delays between successive outputs equal to the period of the reference signal divided by 2n; and
    logic circuitry responsive to the reference signal and the outputs of the tapped delay line to produce the frequency multiplied signal.

\* \* \* \* \*